(12) United States Patent
Sakai

(10) Patent No.: US 11,677,378 B2
(45) Date of Patent: Jun. 13, 2023

(54) ELASTIC WAVE DEVICE

(71) Applicant: Murata Manufacturing Co., Ltd., Nagaokakyo (JP)

(72) Inventor: Ryosuke Sakai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1259 days.

(21) Appl. No.: 16/179,006

(22) Filed: Nov. 2, 2018

(65) Prior Publication Data

US 2019/0165758 A1 May 30, 2019

(30) Foreign Application Priority Data

Nov. 29, 2017 (JP) .............................. JP2017-229527
Oct. 11, 2018 (JP) .............................. JP2018-192316

(51) Int. Cl.
| | |
|---|---|
| *H03H 9/05* | (2006.01) |
| *H03H 9/10* | (2006.01) |
| *H03H 9/25* | (2006.01) |
| *H03H 9/64* | (2006.01) |
| *H03H 9/02* | (2006.01) |
| *H03H 9/145* | (2006.01) |

(Continued)

(52) U.S. Cl.
CPC .... *H03H 9/02937* (2013.01); *H03H 9/02574* (2013.01); *H03H 9/02834* (2013.01); *H03H 9/02866* (2013.01); *H03H 9/059* (2013.01); *H03H 9/1092* (2013.01); *H03H 9/145* (2013.01); *H03H 9/25* (2013.01); *H03H 9/6489* (2013.01); *H10N 30/8542* (2023.02); *H10N 30/8554* (2023.02); *H10N 30/877* (2023.02)

(58) Field of Classification Search
CPC ............ H03H 9/02; H03H 9/145; H03H 9/25; H03H 9/64
See application file for complete search history.

(56) References Cited

U.S. PATENT DOCUMENTS 9,484,885 B2 * 11/2016 Watanabe ............. H01L 41/047
10,659,001 B2 * 5/2020 Yamamoto ............. H03H 9/145
(Continued)

FOREIGN PATENT DOCUMENTS

| JP | 2017-011681 A | 1/2017 |
|---|---|---|
| WO | 2016/208426 A1 | 12/2016 |
| WO | 2016/208428 A1 | 12/2016 |

*Primary Examiner* — Hafizur Rahman
*Assistant Examiner* — Alan Wong
(74) *Attorney, Agent, or Firm* — Keating & Bennett, LLP

(57) ABSTRACT

An elastic wave device includes a piezoelectric thin film, IDT electrodes on the piezoelectric thin film, an insulating layer surrounding the piezoelectric thin film on a primary surface of a support substrate, a spacer layer surrounding the piezoelectric thin film in plan view, and a cover on the spacer layer. The spacer layer includes an outer edge and an inner edge closer than the outer edge to the piezoelectric thin film in plan view. The primary surface of the insulating layer closer to the spacer layer includes a sloping region that extends where the insulating layer overlaps the spacer layer in plan view and in which the distance from the first primary surface of the support substrate along the direction perpendicular or substantially perpendicular to the support substrate increases from the outer edge toward the inner edge.

18 Claims, 7 Drawing Sheets

(51) Int. Cl.
*H10N 30/87* (2023.01)
*H10N 30/853* (2023.01)

(56) References Cited

U.S. PATENT DOCUMENTS

2018/0097502 A1 4/2018 Yamamoto et al.
2018/0102757 A1 4/2018 Fukushima et al.

* cited by examiner

ELASTIC WAVE DEVICE

CROSS REFERENCE TO RELATED APPLICATIONS

This application claims the benefit of priority to Japanese Patent Application No. 2017-229527 filed on Nov. 29, 2017 and Japanese Patent Application No. 2018-192316 filed on Oct. 11, 2018. The entire contents of each of these applications are hereby incorporated herein by reference.

BACKGROUND OF THE INVENTION

1. Field of the Invention

The present invention relates to an elastic wave device and more particularly to an elastic wave device including a support substrate and a piezoelectric thin film.

2. Description of the Related Art

Elastic wave devices including a multilayer film including a piezoelectric thin film on a support substrate are known (e.g., see Japanese Unexamined Patent Application Publication No. 2017-011681).

The elastic wave device described in Japanese Unexamined Patent Application Publication No. 2017-011681 includes a support substrate, a multilayer film, interdigital transducer (IDT) electrodes, external connection terminals (external connection electrodes), an insulating layer, a support layer (spacer layer), and a cover. The multilayer film is on the support substrate and includes a piezoelectric thin film and other layers. The IDT electrodes are on one side of the piezoelectric thin film. The external connection terminals are electrically coupled to the IDT electrodes and also to the outside. Outside the area occupied by the IDT electrodes in plan view and under the external connection terminals, the support substrate includes a region not covered with the multilayer film. The insulating layer extends in at least a portion of this region. The external connection terminals include at least one of an under-bump metal layer and a metallic bump. The support layer is on the insulating layer, surrounding the area of the support substrate occupied by the IDT electrodes. The cover is fastened to the support layer to seal the cavity created by the support layer. There is an empty space inside so as not to restrict the movement of the elastic waves excited by the IDT electrodes, and the cover and support layer seal this empty space.

This type of elastic wave device, however, has the disadvantage of potential penetration of water, for example moisture in the air. The device allows water to penetrate and reach the empty space, for example, through the interface between the insulating layer and support layer, and such water may affect the characteristics of the device.

SUMMARY OF THE INVENTION

Preferred embodiments of the present invention provide elastic wave devices with improved moisture resistance.

According to a preferred embodiment of the present invention, an elastic wave device includes a support substrate, a piezoelectric thin film, interdigital transducer electrodes, wiring layers, an insulating layer, a spacer layer, and a cover. The piezoelectric thin film is directly on or indirectly above a first primary surface of the support substrate. The interdigital transducer electrodes are on the piezoelectric thin film. The wiring layers are electrically coupled to the IDT electrodes. The insulating layer is on the first primary surface of the support substrate and surrounds the piezoelectric thin film. The spacer layer is on the insulating layer at least in a portion and surrounds the piezoelectric thin film in plan view, or when viewed in the direction perpendicular or substantially perpendicular to the support substrate or in the thickness direction. The cover is on the spacer layer and is spaced apart from the IDT electrodes in the thickness direction. The spacer layer includes an outer edge and an inner edge, the inner edge being closer than the outer edge to the piezoelectric thin film in plan view. A first primary surface of the insulating layer, closer to the spacer layer, includes a sloping region that extends where the insulating layer overlaps the spacer layer in plan view and in which the distance from the first primary surface of the support substrate in the thickness direction gradually increases from the outer edge toward the inner edge.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes elastic wave devices according to preferred embodiments of the present invention with reference to the drawings.

FIGS. 1 to 7, are all schematic. The relative sizes and thicknesses of the illustrated elements are not necessarily to scale.

The following describes an elastic wave device 1 according to a preferred embodiment of the present invention with reference to the drawings.

Figure 1:
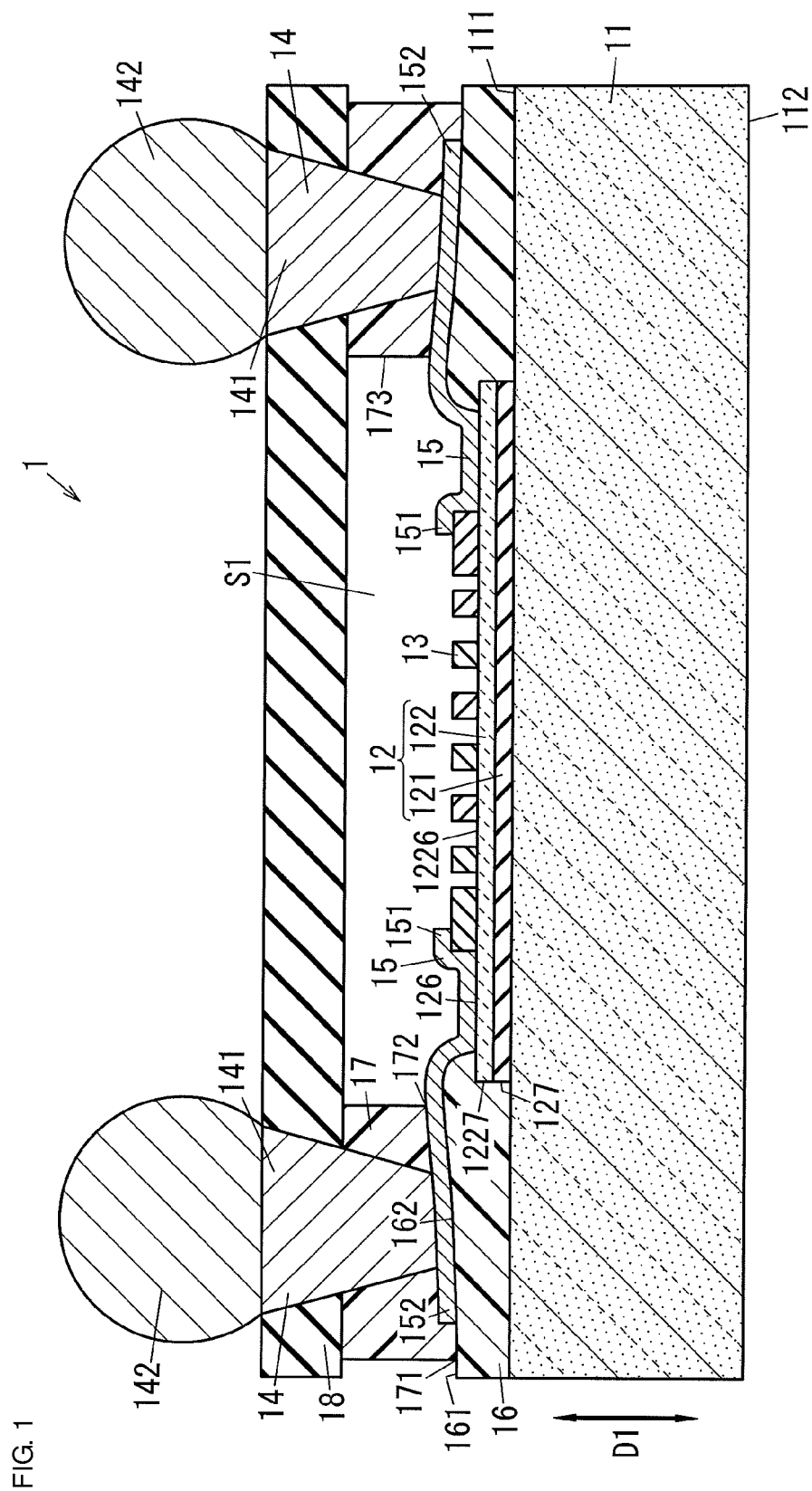
FIG. 1 is a cross-section of an elastic wave device according to a preferred embodiment of the present invention.
Figure 2:
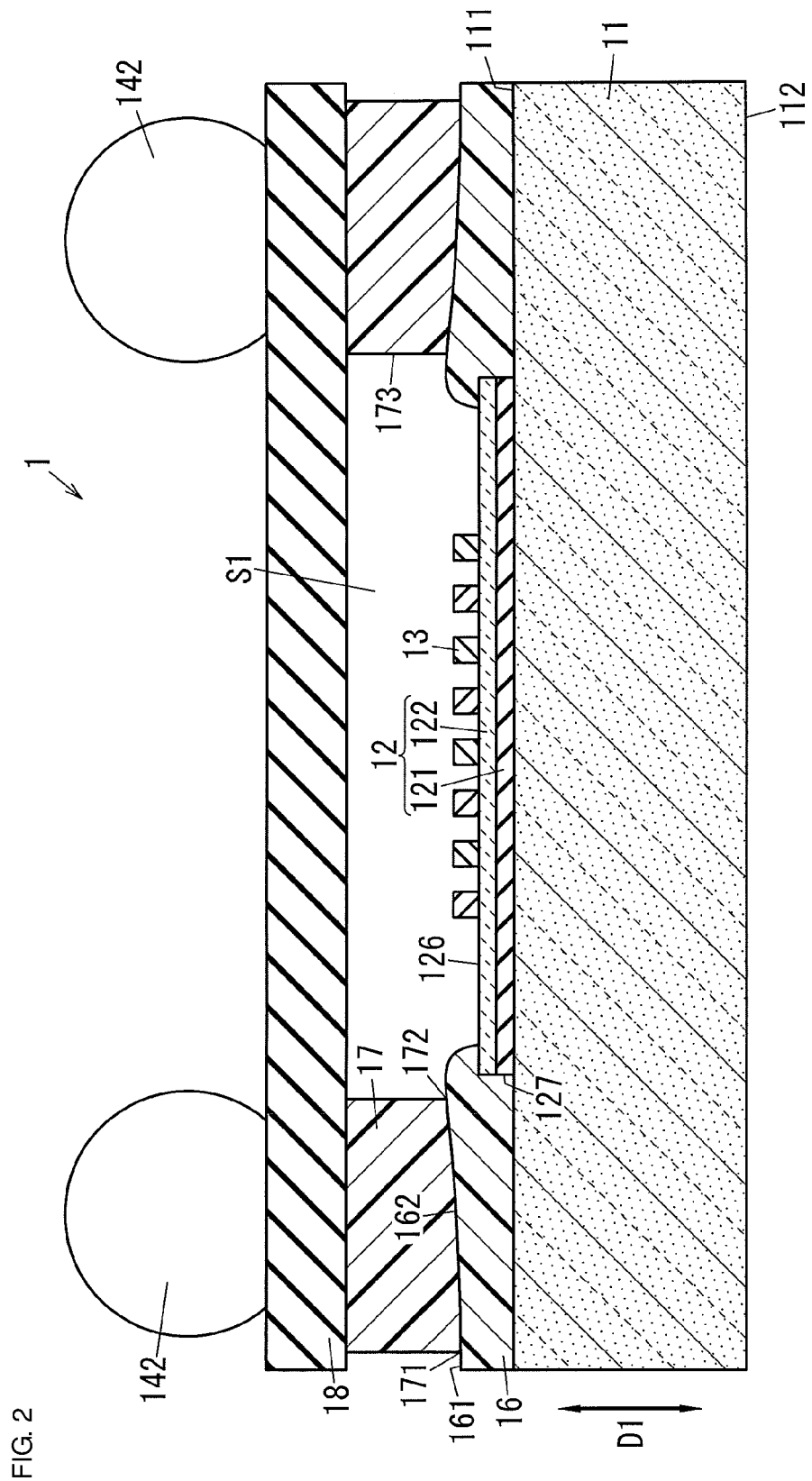
FIG. 2 is another cross-section of the elastic wave device of FIG. 1.
Figure 3:
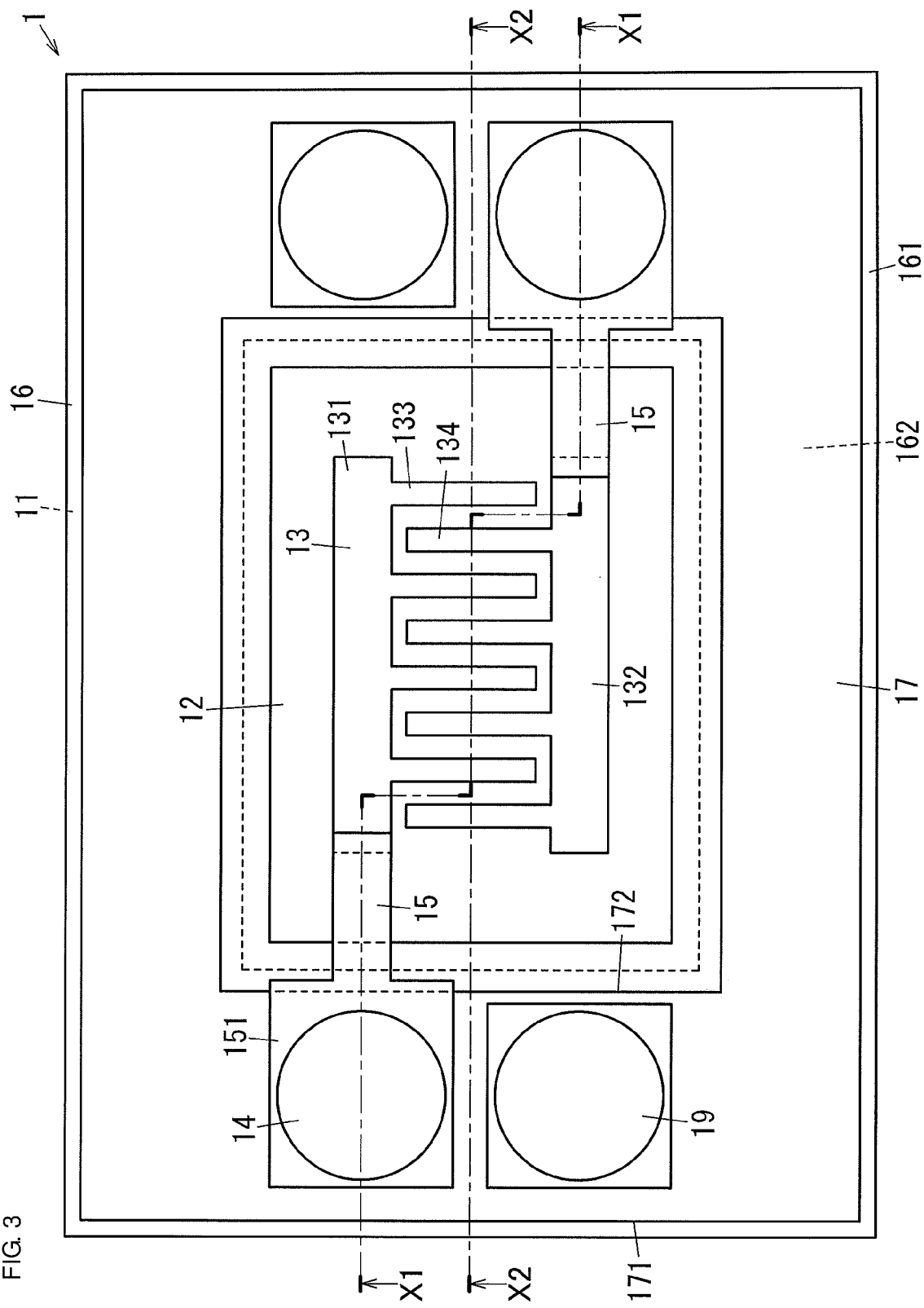
FIG. 3 is a plan view of the elastic wave device of FIG. 1, not illustrating the cover.

As illustrated in FIGS. 1 to 3, the elastic wave device 1 according to the present preferred embodiment includes a support substrate 11, a piezoelectric thin film 122, interdigital transducer (IDT) electrodes 13, two wiring layers 15, an insulating layer 16, a spacer layer 17, and a cover 18. FIG. 1 is a cross-sectional diagram corresponding to the I-I cross-section in FIG. 3. FIG. 2 is a cross-sectional diagram corresponding to the II-II cross-section in FIG. 3. In FIG. 3, the cover 18 (see FIGS. 1 and 2), described hereinafter, is not illustrated.

The piezoelectric thin film 122 is provided on a first primary surface 111 of the support substrate 11. The piezoelectric thin film 122 is spaced apart from the perimeter of the first primary surface 111 of the support substrate 11 in plan view, or when viewed in the direction perpendicular or substantially perpendicular to the support substrate 11 (hereinafter the thickness direction D1). The IDT electrodes 13 are provided on the piezoelectric thin film 122. The piezoelectric thin film 122 therefore is disposed between the first primary surface 111 of the support substrate 11 and the IDT electrodes 13 in the thickness direction D1. The elastic wave device 11 includes a functional film 12 between the first primary surface 111 and IDT electrodes 13, and the functional film 12 includes at least the piezoelectric thin film 122. The wiring layers 15 are electrically coupled to the IDT electrodes 13. The insulating layer 16 is provided on the first primary surface 111 of the support substrate 11 and surrounds the piezoelectric thin film 122. The spacer layer 17 is provided on the insulating layer 16 in at least a portion thereof, surrounds the piezoelectric thin film 122 in plan view, and has a frame shape. The cover 18 is provided on the spacer layer 17. The spacer layer 17 therefore is disposed between the insulating layer 16 and the peripheral area of the cover 18. The cover 18 is spaced apart from the IDT electrodes 13 in the thickness direction D1.

The elastic wave device 1 includes a space S1 surrounded by the cover 18, the spacer layer 17, the insulating layer 16, and a multilayer body (including the piezoelectric thin film 122 and IDT electrodes 13) on the support substrate 11.

The elastic wave device 1 also includes a plurality of (two in the illustrated example) external connection electrodes 14, which provide external connection. The external connection electrodes 14 are electrically coupled to the IDT electrodes 13 by the wiring layers 15.

The following describes the individual components of the elastic wave device 1 with reference to drawings.

As illustrated in FIGS. 1 and 2, the support substrate 11 supports a multilayer body that includes the functional film 12 and IDT electrodes 13. The support substrate 11 includes the first primary surface 111 and a second primary surface 112. The support substrate 11 is preferably made of silicon, for example, and defines a high-acoustic-velocity support substrate, which propagates bulk waves faster than the piezoelectric thin film 122 propagates the elastic waves. The high-acoustic-velocity support substrate is not necessarily a silicon substrate. Examples of other materials that may be used include piezoelectric materials, such as aluminum nitride, aluminum oxide, silicon carbide, silicon nitride, sapphire, lithium tantalate, lithium niobate, and quartz; ceramic materials, such as alumina, zirconia, cordierite, mullite, steatite, and forsterite; and magnesia diamond. A material based on any of these materials or based on a mixture of these materials may also be used.

The interdigital transducer (IDT) electrodes 13 may be made of any suitable metallic material. Examples include aluminum, copper, platinum, gold, silver, titanium, nickel, chromium, molybdenum, tungsten, and alloys based on any of these metals. The IDT electrodes 13 may have a multilayer structure including a plurality of metallic films made of these metals or alloys that are stacked.

As illustrated in FIG. 3, the IDT electrodes 13 include a pair of busbars 131, 132 (first and second busbars 131, 132), a plurality of electrode fingers 133 (first electrode fingers 133), and a plurality of electrode fingers 134 (second electrode fingers 134).

The first and second busbars 131, 132 are elongated with longitudinal axes extending in a direction perpendicular or substantially perpendicular to the thickness direction D1. The first and second busbars 131, 132 face each other in the direction perpendicular or substantially perpendicular to both the thickness direction D1 and the longitudinal axes.

The plurality of first electrode fingers 133 are connected to the first busbar 131 and extend toward the second busbar 132. In the illustrated configuration, the first electrode fingers 133 extend from the first busbar 131 in the direction perpendicular or substantially perpendicular to the longitudinal axis of the first busbar 131. The ends of the first electrode fingers 133 are spaced apart from the second busbar 132. The first electrode fingers 133 preferably have, for example, equal lengths and equal widths.

The plurality of second electrode fingers 134 are connected to the second busbar 132 and extend toward the first busbar 131. In the illustrated configuration, the second electrode fingers 134 extend from the second busbar 132 in the direction perpendicular or substantially perpendicular to the longitudinal axis of the second busbar 132. The ends of the second electrode fingers 134 are spaced apart from the first busbar 131. The second electrode fingers 134 preferably have, for example, equal lengths and equal widths. In the example illustrated in FIG. 3, preferably, the length and width of the second electrode fingers 134 are respectively equal to those of the first electrode fingers 133.

The first electrode fingers 133 and the second electrode fingers 134 alternate, with spaces therebetween, in the direction perpendicular or substantially perpendicular to the direction in which the first and second busbars 131, 132 face each other. Along the longitudinal axis of the first busbar 131, therefore, a first electrode finger 133 and the second electrode finger 134 next to it are spaced apart from each other. The finger period of the IDT electrodes 13 is the distance between the corresponding sides of a first electrode finger 133 and the second electrode finger 134 next to it.

The functional film 12 includes a low-acoustic-velocity film 121, which propagates bulk waves more slowly than the piezoelectric thin film 122 propagates the elastic waves, and the piezoelectric thin film 122, with the piezoelectric thin film 122 provided directly on the low-acoustic-velocity film 121. That is, the piezoelectric thin film 122 is not provided directly on the high-acoustic-velocity support substrate 11. Providing a low-acoustic-velocity film 121 between the high-acoustic-velocity support substrate 11 and the piezoelectric thin film 122 reduces the velocity of the elastic waves. Since an intrinsic nature of elastic waves is that their energy concentrates more with slower velocity of the waves in the medium, the low-acoustic-velocity film 121 confines the energy of the elastic waves to the piezoelectric thin film 122 and the IDT electrodes 13, which excite the elastic waves. As a result, the elastic wave device 1 exhibits a smaller loss and a higher Q than it would without the low-acoustic-velocity film 121.

The piezoelectric thin film 122 is preferably made of, for example, lithium tantalate, lithium niobate, zinc oxide, aluminum nitride, or lead zirconate titanate (PZT).

The low-acoustic-velocity film 121 is preferably made of, for example, silicon oxide, glass, silicon oxynitride, tantalum oxide, a compound resulting from adding fluorine, carbon, or boron to silicon oxide, or a material based on any of these materials.

A combination of a lithium tantalate piezoelectric thin film and a silicon oxide low-acoustic-velocity film enables the elastic wave device 1 to have better temperature characteristics. This combination reduces the absolute temperature coefficient of frequency (TCF) of the elastic wave device 1 due to the negative and positive dependence of the elastic modulus of lithium tantalate and silicon oxide, respectively. Silicon oxide, moreover, has a lower specific acoustic impedance than lithium tantalate. With this selection of materials, therefore, the elastic wave device 1 combines increased electromechanical coupling coefficient (broader fractional bandwidth) with improved TCF.

The thickness of the piezoelectric thin film 122 is preferably equal to or less than about 3.5λ, for example, where λ is the wavelength of the elastic waves, which is determined by the finger period of the IDT electrodes 13. This results in a high Q. A thickness of the piezoelectric thin film 122 of about 2.5λ or less results in a good TCF. A thickness of the piezoelectric thin film 122 of about 1.5λ or less helps control the acoustic velocity of the elastic waves.

The thickness of the low-acoustic-velocity film 121 is preferably equal to or less than about 2.0λ, for example. When the low-acoustic-velocity film 121 is about 2.0λ or thinner, its membrane stress is sufficiently low. In actual production, this limits the amount of warpage of the wafer, which includes a silicon wafer from which support substrates 11 are cut out, thus improving the production yield and producing devices with more consistent characteristics.

The wiring layers 15 electrically couple the external connection electrodes 14 and IDT electrodes 13 together. The wiring layers 15 may be made of any suitable metallic material. Examples include aluminum, copper, platinum, gold, silver, titanium, nickel, chromium, molybdenum, tungsten, and alloys based on any of these metals. The wiring layers 15 may have a multilayer structure including a plurality of metallic films made of these metals or alloys are stacked.

The wiring layers 15 overlap a portion of the IDT electrodes 13, a portion of the piezoelectric thin film 122, and a portion of the insulating layer 16 when viewed in the direction perpendicular or substantially perpendicular to the support substrate 11. The wiring layers 15 include a first connection section 151 and a second connection section 152. The first connection section 151 is provided on the IDT electrodes 13. The second connection section 152 is interposed between the insulating layer 16 and spacer layer 17 and located inward from the perimeter of the insulating layer 16. The external connection electrodes 14 are provided on the second connection section 152 which disposed on the insulating layer 16, of the wiring layers 15.

The insulating layer 16 is electrically insulating. As illustrated in FIGS. 1 to 3, the insulating layer 16 extends along the perimeter of the support substrate 11 on the first primary surface 111 of the support substrate 11. The insulating layer 16 surrounds the lateral side of the piezoelectric thin film 122. In the illustrated configuration, the insulating layer 16 surrounds the lateral side of the functional film 12. The insulating layer 16 has a frame shape in plan view, and a side surface thereof is flush or substantially flush with the lateral side surface of the support substrate 11. A portion of the insulating layer 16 overlaps the peripheral area of the piezoelectric thin film 122. In the illustrated configuration, a portion of the insulating layer 16 overlaps the peripheral area of the functional film 12. The lateral side surface of the piezoelectric thin film 122 is covered with the insulating layer 16. In the illustrated configuration, the lateral side surface of the functional film 12 is covered with the insulating layer 16.

As for material, the insulating layer 16 is preferably made of, for example, a synthetic resin, such as epoxy resin or polyimide.

The spacer layer 17 surrounds the functional film 12 and extends along the perimeter of the support substrate 11 in plan view. The spacer layer 17 has a frame shape in plan view, and outer and inner peripheries thereof are rectangular or substantially rectangular. The spacer layer 17 overlaps the insulating layer 16 when viewed in the thickness direction D1. The outer dimensions of the spacer 17 are smaller than those of the insulating layer 16, and the inner dimensions of the spacer 17 are larger than those of the insulating layer 16. A portion of the spacer 17 also covers the second connection section 152 of the wiring layers 15, extending on a first primary surface 161 of the insulating layer 16. That is, the spacer layer 17 includes two sections: a first section that is disposed directly on a first primary surface 161 of the insulating layer 16 and a second section that is not directly disposed on the first primary surface 161 of the insulating layer 16, with the second connection section 152 of the wiring layers 15 interposed therebetween. In the illustrated configuration, the first section extends entirely or substantially entirely around the perimeter of the first primary surface 161 of the insulating layer 16.

The spacer layer 17 is electrically insulating and is preferably made of, for example, a synthetic resin, such as epoxy resin or polyimide. It is preferable that the spacer layer 17 and insulating layer 16 be made primarily of the same material, and more preferably completely of the same material.

The spacer layer 17 and insulating layer 16 have a combined thickness greater than the combined thickness of the functional film 12 and IDT electrodes 13.

The cover 18 is a flat or substantially flat plate. Its shape in plan view (perimetric shape as viewed in the thickness direction D1) is preferably rectangular or substantially rectangular in the illustrated configuration, but this is not the only option. For example, a square or substantially square cover may be used. The outer dimensions of the cover 18 are the same or substantially the same as those of the support substrate 11. The cover 18 is provided on the spacer layer 17 and is spaced apart from the IDT electrodes 13 in the thickness direction D1.

The space S1 surrounded by the cover 18, the spacer layer 17, the insulating layer 16, and the multilayer body (including the functional film 12 and IDT electrodes 13) on the support substrate 11 is filled with an inert gas, such as nitrogen, for example.

The elastic wave device 1 includes a plurality of (for example, two) external connection electrodes 14, electrodes that provide external connection. The external connection electrodes 14 electrically couple the elastic wave device 1 to, for example, a circuit or packaging board (submount board). The elastic wave device 1 also includes a plurality of (for example, two) mounting electrodes 19, which are not electrically coupled to the IDT electrodes 13. The mounting electrodes 19 improve the parallelism between the elastic wave device 1 and the circuit, the packaging, or another board to which the device is electrically coupled, and are not intended for electrical coupling. That is, the mounting electrodes 19 are intended to prevent the elastic wave device 1 from being mounted aslant on the circuit, the packaging, or the other board to which the device is electrically coupled. The mounting electrodes 19 may therefore be unnecessary depending on, for example, the number and arrangement of the external connection electrodes 14 and the perimetric shape of the elastic wave device 1.

In plan view, or when viewed in the thickness direction D1, the elastic wave device 1 includes two external connection electrodes 14 near two opposite corners of the four corners of the cover 18, one electrode near one corner, and two mounting electrodes 19 near the remaining two corners, one electrode near one corner, and none of the two external connection electrodes 14 and two mounting electrodes 19 overlaps the functional film 12.

The external connection electrodes 14 include a through section 141 that extends through the spacer layer 17 and cover 18 in the thickness direction D1. The through section 141 is disposed on and electrically coupled to the second connection section 152 of a wiring layer 15. The external connection electrodes 14 also include a bump 142 on the through section 141, such that the through section 141 defines an under-bump metal layer. The bump 142 is electrically conductive and is bonded to and electrically coupled to the through section 141. The mounting electrodes 19 include a through section that extends through the spacer layer 17 and cover 18 in the thickness direction D1, and also include a bump on the through section.

The through section 141 may be made of any suitable metallic material. Examples include copper, nickel, and alloys based on any of these metals. The bump 142 is preferably, for example, a solder bump or is made of gold or copper. The through section of the mounting electrodes 19 is preferably made of the same material as the through section 141 of the external connection electrodes 14. The bump of the mounting electrodes 19 is preferably made of the same material as the bump 142 of the external connection electrodes 14.

The spacer layer 17 includes an outer edge 171 and an inner edge 172. In plan view, or when viewed in the thickness direction D1, the outer edge 171 is farther from the piezoelectric thin film 122, and the inner edge 172 is closer than the outer edge 171 to the piezoelectric thin film 122. The first primary surface 161 of the insulating layer 16, closer to the spacer layer 17, includes a sloping region 162 that extends in a region in which the insulating layer 16 overlaps the spacer layer 17 in plan view and in which the distance from the first primary surface 111 of the support substrate 11 in the thickness direction D1 gradually increases from the outer edge 171 toward the inner edge 172.

As for thickness, the low-acoustic-velocity film 121 is preferably, for example, about 600 nm thick. The piezoelectric thin film 122 is preferably, for example, about 600 nm thick, and the IDT electrodes 13 are preferably, for example, about 150 nm thick. The insulating layer 16 is slightly thicker than the functional film 12, which includes the low-acoustic-velocity film 121 and piezoelectric thin film 122, and is preferably, for example, between about 1.3 µm and about 1.5 µm thick. The insulating layer covers a portion of a first primary surface 1226 of the piezoelectric thin film 122, farther from the support substrate 11, and the side 1227 of the piezoelectric thin film 122. A first primary surface 161 of the insulating layer 16 is convex or substantially convex within the portion closer than the sloping region 162 to the piezoelectric thin film 122. In the illustrated configuration, the first primary surface 161 of the insulating layer 16 is convex or substantially convex within the portion closer than the sloping region 162 to the functional film 12.

The sloping region 162 of the first primary surface 161 of the insulating layer 16 surrounds the entire or substantially the entire perimeter of the piezoelectric thin film 122. In the illustrated configuration, the sloping region 162 of the first primary surface 161 of the insulating layer 16 surrounds the entire perimeter of the functional film 12.

The wiring layers 15 cross only the inner edge 172 of the spacer layer 17, and do not cross the outer edge 171. In other words, the wiring layers 15 are located inward from the perimeter of the insulating layer 16 in plan view, such that the spacer layer 17 is in contact with the insulating layer 16 around the entire or substantially the entire perimeter of the insulating layer 16.

The following is a brief description of a non-limiting exemplary process for the fabrication of elastic wave devices 1.

First, a silicon wafer 110 (FIG. 4A) is prepared from which the respective support substrates 11 of the multiple elastic wave devices 1 are cut out.

A functional film 12 is then formed on a first primary surface 1101 (FIG. 4A) of the silicon wafer 110, and an insulating layer 16 and a spacer layer 17 are formed one after another. After a cover 18 is bonded to the spacer layer 17, the cover 18 and spacer layer 17 are perforated to create through holes at the points at which external connection electrodes 14 are to be formed. External connection electrodes 14 are formed to fill the through holes, to form a silicon wafer 110 with multiple elastic wave devices 1 formed thereon. The first primary surface 1101 of the silicon wafer 110 corresponds to the first primary surface 111 of the support substrates 11.

Figure 4A:
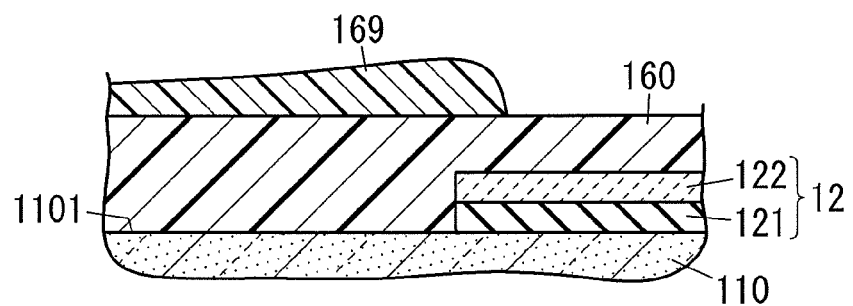
FIGS. 4A and 4B are step cross-sectional diagrams for explaining a method for fabricating the elastic wave device of FIG. 1.
Figure 4B:
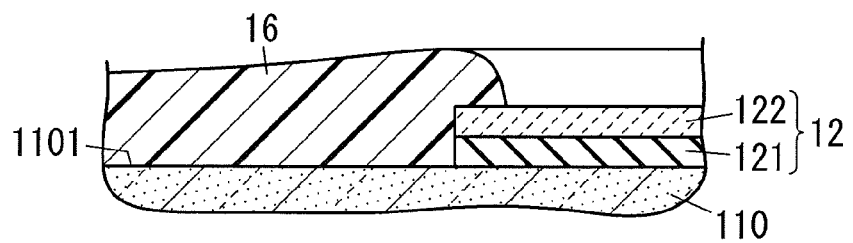

To form the insulating layer 16, a precursor insulating film 160 is formed, for example by spin coating, on the first primary surface 1101 of the silicon wafer 110, covering both the functional film 12 and the region not occupied by the functional film 12. A resist layer 169 is then formed (FIG. 4A) to be used for three-dimensional photolithographic patterning of the insulating film 160 using a grayscale mask. The resist layer 169 and a portion of the insulating film 160 are then etched away, leaving the insulating layer 16 (FIG. 4B).

The resulting wafer is cut into multiple elastic wave devices 1, for example, using a dicing saw or laser.

An elastic wave device 1 according to a preferred embodiment of the present invention includes a support substrate 11, a piezoelectric thin film 122, IDT electrodes 13, wiring layers 15, an insulating layer 16, a spacer layer 17, and a cover 18. The piezoelectric thin film 122 is disposed above a first primary surface 111 of the support substrate 11 but not directly thereon. The wiring layers 15 are electrically coupled to the IDT electrodes 13. The insulating layer 16 is provided on the first primary surface 111 of the support substrate 11 and surrounds the piezoelectric thin film 122. The spacer layer 17 is provided on the insulating layer 16 at least in a portion thereof and surrounds the piezoelectric thin film 122 in plan view, or when viewed in the direction perpendicular or substantially perpendicular to the support substrate 11 or in the thickness direction D1. The cover 18 is provided on the spacer layer 17 and is spaced apart from the IDT electrodes 13 in the thickness direction D1. The spacer layer 17 includes an outer edge 171 and an inner edge 172, the inner edge 172 being closer than the outer edge 171 to the piezoelectric thin film 122 in plan view. A first primary surface 161 of the insulating layer 16, closer to the spacer layer 17, includes a sloping region 162 that extends in a region in which the insulating layer 16 overlaps the spacer layer 17 in plan view and in which the distance from the first primary surface 111 of the support substrate 11 in the thickness direction D1 gradually increases from the outer edge 171 toward the inner edge 172.

The sloping region 162 of the first primary surface 161 of the insulating layer 16, closer to the spacer layer 17, increases the distance between the outer edge 171 and inner edge 172 of the spacer layer 17 at the interface between the insulating layer 16 and spacer layer 17. As a result, the elastic wave device 1 according to a preferred embodiment of the present invention has improved moisture resistance and, therefore, improved reliability.

Moreover, the insulating layer 16 covers a portion of a first primary surface 1226 of the piezoelectric thin film 122, farther from the support substrate 11, and the side surface 1227 of the piezoelectric thin film 122. This prevents separation between the piezoelectric thin film 122 and the support substrate 11. In the illustrated configuration, the insulating layer 16 covers a portion of a first primary surface 126 of the functional film 12, farther from the support substrate 11, and the side surface 127 of the functional film 12. This prevents the functional film 12 from detaching from the support substrate 11. In the illustrated configuration, furthermore, a first primary surface 161 of the insulating layer 16, closer to the spacer layer 17, includes a sloping region 162 that extends in a region in which the insulating layer 16 overlaps the spacer layer 17 in plan view and in which the distance from the first primary surface 111 of the support substrate 11 in the thickness direction D1 gradually increases from the outer edge 171 toward the inner edge 172. With this structure, the insulating layer 16 is thinner than would be if the distance between the surface of the insulating layer closer to the spacer layer and the surface of the support substrate in the thickness direction gradually increased from the inner edge toward the outer edge at which the insulating layer overlaps the spacer layer in plan view. The elastic wave device 1 therefore has improved moisture resistance with a reduced or minimal increase in the height from the support substrate 11 to the cover 18.

The first primary surface 161 of the insulating layer 16 is convex or substantially convex within the portion closer than the sloping region 162 to the functional film 12. This makes it more difficult for external water to reach the IDT electrodes 13 than would be if the first primary surface 161 of the insulating layer 16 were not convex or substantially convex within the portion closer than the sloping region 162 to the functional film 12.

The sloping region 162, moreover, surrounds the entire or substantially the entire perimeter of the piezoelectric thin film 122. This makes the elastic wave device 1 more resistant to moisture than would be if the sloping region 162 did not surround the entire or substantially the entire perimeter of the piezoelectric thin film 122. In the illustrated configuration, the sloping region 162 surrounds the entire perimeter of the functional film 12. This makes the elastic wave device 1 more resistant to moisture than would be if the sloping region 162 did not surround the entire perimeter of the functional film 12.

The spacer layer 17 is in contact with the insulating layer 16 around the entire or substantially the entire perimeter of the insulating layer 16. This further improves the airtightness of the space S1 surrounded by the cover 18, the spacer layer 17, the insulating layer 16, and the multilayer body, including the piezoelectric thin film 122 and IDT electrodes 13, on the support substrate 11, thus improving the reliability of the elastic wave device 1.

Moreover, the wiring layers 15 include a first connection section 151 and a second connection section 152. The first connection section 151 is provided on the IDT electrodes 13. The second connection section 152 is interposed between the insulating layer 16 and the spacer layer 17 and located inward from the perimeter of the insulating layer 16. The elastic wave device 1 also includes external connection electrodes 14 that provide external connection. The external connection electrodes 14 are provided on the second connection section 152 of the wiring layers 15 and are electrically coupled to the wiring layers 15. The external connection electrodes 14 include a through section 141 that extends through the spacer layer 17 and the cover 18 in the thickness direction D1. This also improves the airtightness of the space S1 surrounded by the cover 18, the spacer 17, the insulating layer 16, and the multilayer body, including the piezoelectric thin film 122 and IDT electrodes 13, on the support substrate 11 and improves the reliability of the elastic wave device 1.

It is to be noted that the above-described preferred embodiment is merely one of various preferred embodiments of the present invention. As long as the advantageous effects of the present invention are achieved, various modifications may be made to the above-described preferred embodiment, for example according to design.

Figure 5:
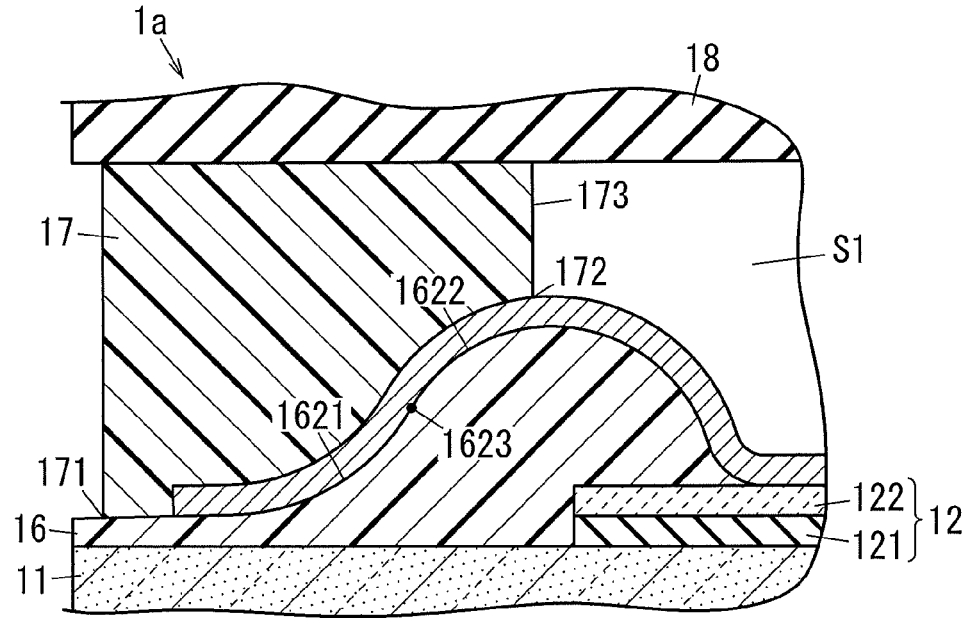
FIG. 5 is a cross-section of an elastic wave device according to Variation 1 of a preferred embodiment of the present invention, illustrating essential components of the device.

In an elastic wave device 1a according to Variation 1 of a preferred embodiment of the present invention, illustrated in FIG. 5, the sloping region 162 includes, in a plane perpendicular or substantially perpendicular to the perimeter of the spacer layer 17, an inflection point 1623 at which a curve 1621 closer to the outer edge 171 and convex or substantially convex toward the support substrate 11 meets a curve 1622 closer to the inner edge 172 and convex or substantially convex toward the cover 18. The remaining configuration of the elastic wave device 1a is the same or substantially the same as that of the elastic wave device 1, and is not illustrated or described.

The elastic wave device 1a, according to Variation 1, has improved moisture resistance.

Figure 6:
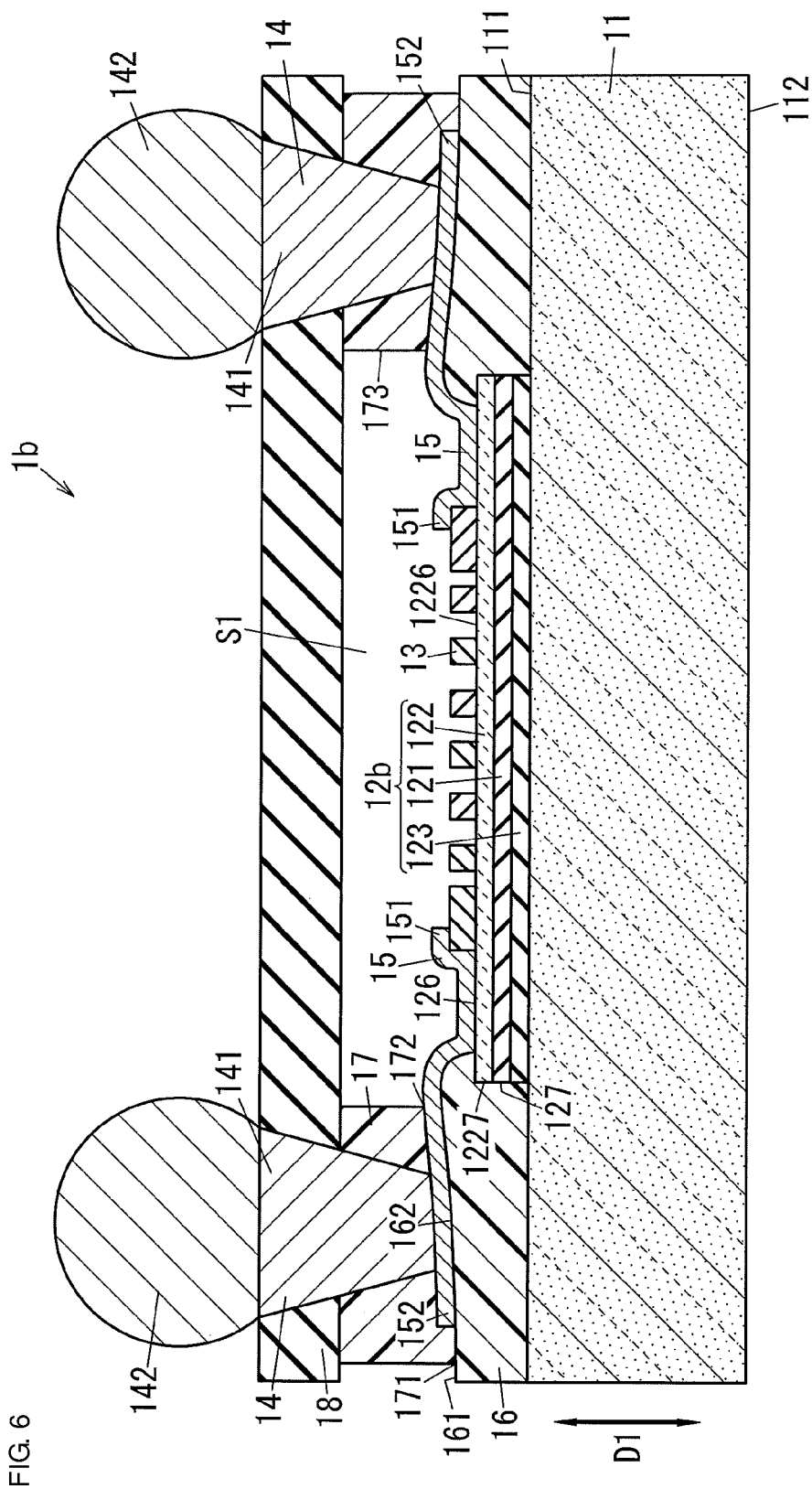
FIG. 6 is a cross-section of an elastic wave device according to Variation 2 of a preferred embodiment of the present invention.

In an elastic wave device 1b according to Variation 2 of a preferred embodiment of the present invention, as illustrated in FIG. 6, the functional film 12b includes a high-acoustic-velocity film 123, a low-acoustic-velocity film 121, and the piezoelectric thin film 122. The high-acoustic-velocity film 123 is provided directly on the support substrate 11 and propagates bulk waves faster than the piezoelectric thin film 122 propagates the elastic waves. The low-acoustic-velocity film 121 is provided on the high-acoustic-velocity film 123 and propagates bulk waves more slowly than the piezoelectric thin film 122 propagates the elastic waves. The piezoelectric thin film 122 is provided on the low-acoustic-velocity film 121. The components of the elastic wave device 1b that are the same or substantially the same those of the elastic wave device 1 are referenced by the same numerals as in the above-described preferred embodiment and are not described.

In the elastic wave device 1b, the high-acoustic-velocity film 123 confines the elastic waves to the stack of the piezoelectric thin film 122 and the low-acoustic-velocity film 121. The elastic waves are blocked from leaking down into the structure beneath the high-acoustic-velocity film 123.

With this structure, the energy of the elastic waves of the particular mode that makes the device a filter or resonator is distributed throughout the piezoelectric thin film 122 and the low-acoustic-velocity film 121 and in a portion of the high-acoustic-velocity film 123 closer to the low-acoustic-velocity film 121 but not in the support substrate 11. This approach of confining the elastic waves using the high-acoustic-velocity film 123 is based on the same mechanism as in the case of Love-wave surface acoustic waves, which are non-leaky SH (shear horizontal) waves, and is described in, for example, pp. 26-28 of Kenya Hashimoto, *Introduction to Simulation Technologies for Surface Acoustic Wave Devices* (in Japanese), Realize Science & Engineering. This mechanism differs from the mechanism of confining elastic waves using a Bragg reflector defined by an acoustic multilayer film.

The high-acoustic-velocity film 123 is preferably made of, for example, a piezoelectric material, such as diamond-like carbon, aluminum nitride, aluminum oxide, silicon carbide, silicon nitride, silicon, sapphire, lithium tantalate, lithium niobate, or quartz; a ceramic material, such as alumina, zirconia, cordierite, mullite, steatite, or forsterite; magnesia diamond; a material based on any of these materials; or a material based on a mixture of these materials.

As for the thickness of the high-acoustic-velocity film 123, the thicker the better, given the function of the high-acoustic-velocity film 123 of confining the elastic waves to the piezoelectric thin film 122 and the low-acoustic-velocity film 121.

The elastic wave device 1b according to Variation 2 has improved moisture resistance.

Figure 7:
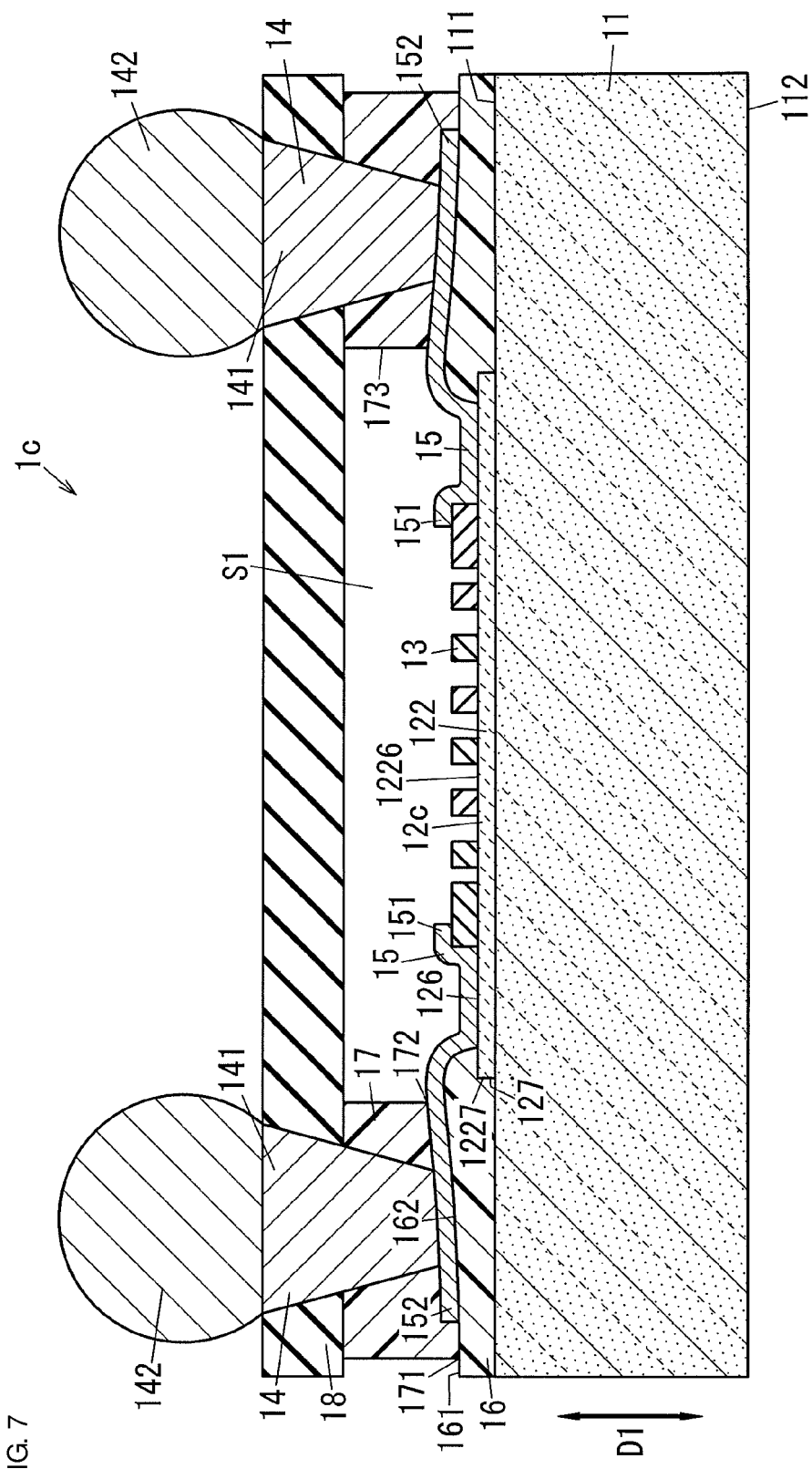
FIG. 7 is a cross-section of an elastic wave device according to Variation 3 of a preferred embodiment of the present invention.

In an elastic wave device 1c according to Variation 3 of a preferred embodiment of the present invention, as illustrated in FIG. 7, the piezoelectric thin film 122 is the only component of a functional film 12c that is provided directly on the support substrate 11. That is, the piezoelectric thin film 122 is provided directly on the first primary surface 111 of the support substrate 11. The components of the elastic wave device 1c that are the same or substantially the same as those of the elastic wave device 1 are referenced by the same numerals as in the above-described preferred embodiment and are not described.

The support substrate 11 defines and functions as a high-acoustic-velocity support substrate, which propagates bulk waves faster than the piezoelectric thin film 122 propagates the elastic waves.

The elastic wave device 1c according to Variation 3 has improved moisture resistance.

In the elastic wave devices 1, 1a, the functional film 12 may include an extra film between the low-acoustic-velocity film 121 and the support substrate 11. In the elastic wave device 1b, the functional film 12b may include an extra film between the high-acoustic-velocity film 123 and the support substrate 11 and/or between the low-acoustic-velocity film 121 and the piezoelectric thin film 122. In the elastic wave devices 1, 1a, the functional film 12 may include an acoustic impedance layer between the piezoelectric thin film 122 and the support substrate 11, instead of the low-acoustic-velocity film 121. The acoustic impedance layer blocks the elastic waves excited at the IDT electrodes 13 from leaking into the support substrate 11 and has a multilayer structure including at least one high-acoustic-impedance layer, which has relatively high acoustic impedance, and at least one low-acoustic-impedance layer, which has relatively low acoustic impedance, stacked in the thickness direction D1 perpendicular or substantially perpendicular to the support substrate 11. When the multilayer structure includes a plurality of high-acoustic-impedance layers and a plurality of low-acoustic-impedance layers, the two types of layers are alternately stacked in the thickness direction D1.

The high-acoustic-impedance layer(s) is preferably made of, for example, platinum, tungsten, lithium tantalate, sapphire, lithium niobate, silicon nitride, or zinc oxide.

The low-acoustic-impedance layer(s) is preferably made of, for example, silicon oxide, aluminum, or titanium.

Although the elastic wave devices 1, 1a, 1b, 1c include a pair of IDT electrodes 13 on the piezoelectric thin film 122, a plurality of pairs of IDT electrodes 13 may be provided. When an elastic wave device 1, 1a, 1b, or 1c includes a plurality of pairs of IDT electrodes 13, a plurality of surface acoustic wave resonators each including a pair of IDT electrodes 13 may be electrically coupled together to define a band-pass filter. Moreover, the two external connection electrodes 14 are not the only option. There may be three or more external connection electrodes 14.

In the elastic wave devices 1, 1a, 1b, 1c, moreover, the external connection electrodes 14 including at least a through section 141 are optional. Instead, the wiring layers 15 may extend beyond the edge of the spacer layer 17, and at least a portion of the portion sticking out of the spacer layer 17 may define and function as external connection electrodes.

Furthermore, the insulating layer 16 and spacer layer 17 in the elastic wave devices 1, 1a, 1b, 1c do not need to be made of a synthetic resin or other organic material. Inorganic materials may also be used.

From the above preferred embodiment and variations, it is clear that the following aspects are disclosed.

An elastic wave devices (1; 1a; 1b; 1c) according to a preferred embodiment of the present invention includes a support substrate (11), a piezoelectric thin film (122), interdigital transducer electrodes (13), wiring layers (15), an insulating layer (16), a spacer layer (17), and a cover (18). The piezoelectric thin film (122) is provided directly on or indirectly above a first primary surface (111) of the support substrate (11). The interdigital transducer electrodes (13) are provided on the piezoelectric thin film (122). The wiring layers (15) are electrically coupled to the IDT electrodes (13). The insulating layer (16) is provided on the first primary surface (111) of the support substrate (11) and surrounds the piezoelectric thin film (122). The spacer layer (17) is provided on the insulating layer (16) at least in a portion thereof and surrounds the piezoelectric thin film (122) in plan view, or when viewed in the direction perpendicular or substantially perpendicular to the support substrate (11) or in the thickness direction (D1). The cover (18) is provided on the spacer layer (17) and is spaced apart from the IDT electrodes (13) in the thickness direction (D1). The spacer layer (17) includes an outer edge (171) and an inner edge (172), the inner edge (172) being closer than the outer edge (171) to the piezoelectric thin film (122) in plan view. A first primary surface (161) of the insulating layer (16), closer to the spacer layer (17), includes a sloping region (162) that extends in a regions in which the insulating layer (16) overlaps the spacer layer (17) in plan view and in which the distance from the first primary surface (111) of the support substrate (11) in the thickness direction (D1) gradually increases from the outer edge (171) toward the inner edge (172).

The elastic wave device according to the present preferred embodiment has improved moisture resistance.

In an elastic wave device according to a preferred embodiment, the insulating layer (16) covers a portion of a first primary surface (1226) of the piezoelectric thin film (122), farther from the support substrate (11), and also covers the side surface (1227) of the piezoelectric thin film (122).

The elastic wave device according to present preferred embodiments is less likely to suffer separation between the piezoelectric thin film (122) and the support substrate (11). It is to be noted that in the elastic wave devices (1; 1a; 1b; 1c), the first primary surface (161) of the insulating layer (16), closer to the spacer layer (17), includes a sloping region (162) that extends in a region in which the insulating layer (16) overlaps the spacer layer (17) in plan view and in which the distance from the first primary surface (111) of the support substrate (11) in the thickness direction (D1) gradually increases from the outer edge (171) toward the inner edge (172). With this structure, the insulating layer (16) is thinner than would be if the distance between the primary surface of the insulating layer closer to the spacer layer and the first primary surface of the support substrate in the thickness direction gradually increased from the inner edge toward the outer edge at which the insulating layer overlaps the spacer layer in plan view. The elastic wave devices (1; 1a; 1b; 1c) therefore each have improved moisture resistance with a reduced or minimal increase in the height from the support substrate (11) to the cover (18).

In an elastic wave device according to a preferred embodiment of the present invention, the first primary surface (161) of the insulating layer (16) is convex or substantially convex within the portion closer than the sloping region (162) to the piezoelectric thin film (122).

The elastic wave device according to the present invention is thus, less likely to suffer penetration of external water to the IDT electrodes (13) than would be if the first primary surface (161) of the insulating layer (16) were not convex or substantially convex within the portion closer than the sloping region (162) to the piezoelectric thin film (122).

In an elastic wave device (1a) according to a preferred embodiment of the present invention, the sloping region (162) includes, in a plane perpendicular or substantially perpendicular to the perimeter of the spacer layer (17), an inflection point (1623) at which a curve (1621) closer to the outer edge (171) and convex or substantially convex toward the support substrate (11) meets a curve (1622) closer to the inner edge (172) and convex or substantially convex toward the cover (18).

The elastic wave device (1a) according to the present preferred embodiment has improved in moisture resistance with a reduced or minimal increase in the thickness of the device (1a).

In an elastic wave device according to a preferred embodiment of the present invention, the sloping region (162) surrounds the entire or substantially the entire perimeter of the piezoelectric thin film (122) such that the elastic wave devices (1; 1a; 1b; 1c) are each more resistant to moisture than would be if the sloping region (162) did not surround the entire or substantially the entire perimeter of the piezoelectric thin film (122).

In an elastic wave device according to a preferred embodiment of the present invention, the spacer layer (17) is in contact with the insulating layer (16) around the entire or substantially the entire perimeter of the insulating layer (16).

The elastic wave device (1; 1a; 1b; 1c) according the present preferred embodiment has improved reliability due to increased airtightness of the space (S1) surrounded by the cover (18), the spacer layer (17), the insulating layer (16), and the multilayer body, including the piezoelectric thin film (122) and IDT electrodes (13), on the support substrate (11).

In an elastic wave device (1; 1a; 1b; 1c) according to a preferred embodiment of the present invention, the wiring layers (15) include a first connection section (151) and a second connection section (152). The first connection section (151) is provided on the IDT electrodes (13). The second connection section (152) is interposed between the insulating layer (16) and spacer layer (17) and located inward from the perimeter of the insulating layer (16). The elastic wave device according to the present preferred embodiment also includes external connection electrodes (14). The external connection electrodes (14) are provided on the second connection section (152) of the wiring layers (15) and are electrically coupled to the wiring layers (15). The external connection electrodes (14) include a through section (141) that extends through the spacer layer (17) and cover (18) in the thickness direction (D1).

The elastic wave device (1; 1a; 1b; 1c) according to the present preferred embodiment has improved reliability due to increased airtightness of the space (S1) surrounded by the cover (18), the spacer layer (17), the insulating layer (16), and the multilayer body, including the piezoelectric thin film (122) and IDT electrodes (13), on the support substrate (11).

An elastic wave device (1; 1a) according to a preferred embodiment of the present invention further includes a low-acoustic-velocity film (121). The low-acoustic-velocity film (121) is disposed on the first primary surface (111) of the support substrate (11) between the support substrate (11) and the piezoelectric thin film (122) and propagates bulk waves more slowly than the piezoelectric thin film (122) propagates the elastic waves. The piezoelectric thin film (122) is provided on the low-acoustic-velocity film (121). The support substrate (11) defines a high-acoustic-velocity support substrate, which propagates bulk waves faster than the piezoelectric thin film (122) propagates the elastic waves.

The elastic wave device (1; 1a) according to the present preferred exhibits a smaller loss and a higher Q than it would without the low-acoustic-velocity film (121).

An elastic wave device (1b) according to a preferred embodiment of the present invention further includes a high-acoustic-velocity film (123) and a low-acoustic-velocity film (121). The high-acoustic-velocity film (123) is disposed directly on the first primary surface (111) of the support substrate (11) between the support substrate (11) and the piezoelectric thin film (122) and propagates bulk waves faster than the piezoelectric thin film (122) propagates the elastic waves. The low-acoustic-velocity film (121) is disposed on the high-acoustic-velocity film (123) between the support substrate (11) and the piezoelectric thin film (122) and propagates bulk waves more slowly than the piezoelectric thin film (122) propagates the elastic waves. The piezoelectric thin film (122) is on the low-acoustic-velocity film (121).

In the elastic wave device (1b) according to the present preferred embodiment, elastic waves leaking into the support substrate (11) are reduced.

In an elastic wave device (1; 1a; 1b; 1c) according to a preferred embodiment of the present invention, the piezoelectric thin film (122) is made of lithium tantalate, lithium niobate, zinc oxide, aluminum nitride, or lead zirconate titanate.

In an elastic wave device (1; 1a) according to a preferred embodiment of the present invention, the piezoelectric thin film (122) is made of lithium tantalate, lithium niobate, zinc oxide, aluminum nitride, or lead zirconate titanate. The low-acoustic-velocity film (121) includes at least one material selected from the group consisting of silicon oxide, glass, silicon oxynitride, tantalum oxide, and a compound resulting from adding fluorine, carbon, or boron to silicon oxide.

In an elastic wave device (1; 1a) according to a preferred embodiment of the present invention, the high-acoustic-velocity support substrate includes at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, and magnesia diamond.

In an elastic wave device (1b) according to a preferred embodiment of the present invention, the piezoelectric thin film (122) is made of lithium tantalate, lithium niobate, zinc oxide, aluminum nitride, or lead zirconate titanate. The low-acoustic-velocity film (121) includes at least one material selected from the group consisting of silicon oxide, glass, silicon oxynitride, tantalum oxide, and a compound resulting from adding fluorine, carbon, or boron to silicon oxide.

In an elastic wave device (1b) according to a preferred embodiment of the present invention, the high-acoustic-velocity film (123) includes at least one material selected from the group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, and magnesia diamond.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate;
   a piezoelectric thin film directly on or indirectly above a first primary surface of the support substrate;
   interdigital transducer electrodes on the piezoelectric thin film;
   wiring layers electrically coupled to the interdigital transducer electrodes;
   an insulating layer on the first primary surface of the support substrate, the insulating layer surrounding the piezoelectric thin film;
   a spacer layer at least a portion of which is on the insulating layer, the spacer layer surrounding the piezoelectric thin film when viewed in a thickness direction of the support substrate; and
   a cover on the spacer layer, the cover being spaced apart from the interdigital transducer electrodes in the thickness direction; wherein
   the spacer layer includes an outer edge and an inner edge closer than the outer edge to the piezoelectric thin film in plan view;
   a first primary surface of the insulating layer, closer to the spacer layer, including a sloping region that extends in a region in which the insulating layer overlaps the spacer layer in plan view and in which a distance from the first primary surface of the support substrate in the thickness direction increases from the outer edge toward the inner edge;
   the insulating layer covers a portion of a first primary surface of the piezoelectric thin film, farther from the support substrate, and also covers a lateral side surface of the piezoelectric thin film; and
   the first primary surface of the insulating layer is convex or substantially convex within a portion closer than the sloping region to the piezoelectric thin film.

2. The elastic wave device according to claim 1, wherein the sloping region includes, in a plane perpendicular or substantially perpendicular to a perimeter of the spacer layer, an inflection point at which a curve closer to the outer edge and convex or substantially convex toward the support substrate meets a curve closer to the inner edge and convex or substantially convex toward the cover.

3. The elastic wave device according to claim 1, wherein the sloping region surrounds an entire or substantially an entire perimeter of the piezoelectric thin film.

4. The elastic wave device according to claim 3, wherein the spacer layer is in contact with the insulating layer around an entire or substantially an entire perimeter of the insulating layer.

5. The elastic wave device according to claim 4, wherein the wiring layers include:
   a first connection section located on the IDT electrodes; and
   a second connection section interposed between the insulating layer and the spacer layer and located inward from the perimeter of the insulating layer;
   the device further includes external connection electrodes provided on the second connection section of the wiring layers and electrically coupled to the wiring layers; and
   the external connection electrodes include a through section that extends through the spacer layer and the cover in the thickness direction.

6. The elastic wave device according to claim 1, further comprising:
   a low-acoustic-velocity film disposed on the first primary surface of the support substrate between the support substrate and the piezoelectric thin film, the low-acoustic-velocity film structured to propagate a bulk wave more slowly than the piezoelectric thin film propagates an elastic wave; wherein
   the piezoelectric thin film is provided on the low-acoustic-velocity film; and
   the support substrate defines a high-acoustic-velocity support substrate, which propagates a bulk wave faster than the piezoelectric thin film propagates the elastic wave.

7. The elastic wave device according to claim 6, wherein the piezoelectric thin film is made of lithium tantalate, lithium niobate, zinc oxide, aluminum nitride, or lead zirconate titanate; and
   the low-acoustic-velocity film includes at least one material selected from the group consisting of silicon oxide, glass, silicon oxynitride, tantalum oxide, and a compound resulting from adding fluorine, carbon, or boron to silicon oxide.

8. The elastic wave device according to claim 7, wherein the high-acoustic-velocity support substrate includes at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, and magnesia diamond.

9. The elastic wave device according to claim 1, further comprising:
   a high-acoustic-velocity film disposed directly on the first primary surface of the support substrate between the support substrate and the piezoelectric thin film, the high-acoustic-velocity film structured to propagate a bulk wave faster than the piezoelectric thin film propagates an elastic wave; and
   a low-acoustic-velocity film disposed on the high-acoustic-velocity film between the support substrate and the piezoelectric thin film, the low-acoustic-velocity film structured to propagate a bulk wave more slowly than the piezoelectric thin film propagates the elastic wave; wherein the piezoelectric thin film is provided on the low-acoustic-velocity film.

10. The elastic wave device according to claim 9, wherein
the piezoelectric thin film is made of lithium tantalate, lithium niobate, zinc oxide, aluminum nitride, or lead zirconate titanate; and the low-acoustic-velocity film includes at least one material selected from the group consisting of silicon oxide, glass, silicon oxynitride, tantalum oxide, and a compound resulting from adding fluorine, carbon, or boron to silicon oxide.

11. The elastic wave device according to claim 10, wherein the high-acoustic-velocity film includes at least one material selected from the group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, and magnesia diamond.

12. The elastic wave device according to claim 1, wherein the piezoelectric thin film is made of lithium tantalate, lithium niobate, zinc oxide, aluminum nitride, or lead zirconate titanate.

13. The elastic wave device according to claim 1, wherein a thickness of the piezoelectric thin film is equal to or less than about $3.5\lambda$, where $\lambda$ is a wavelength of elastic waves that is determined by a finger period of the interdigital transducer electrodes.

14. The elastic wave device according to claim 6, wherein a thickness of the low-acoustic-velocity film is equal to or less than about $2.0\lambda$, where $\lambda$ is a wavelength of elastic waves that is determined by a finger period of the interdigital transducer electrodes.

15. The elastic wave device according to claim 1, wherein the wiring layers are made of at least one of aluminum, copper, platinum, gold, silver, titanium, nickel, chromium, molybdenum, tungsten, or an alloy of any of aluminum, copper, platinum, gold, silver, titanium, nickel, chromium, molybdenum, or tungsten.

16. The elastic wave device according to claim 1, wherein the wiring layers overlap a portion of the interdigital transducer electrodes, a portion of the piezoelectric thin film, and a portion of the insulating layer when viewed in the thickness direction.

17. The elastic wave device according to claim 1, wherein a portion of the insulating layer overlaps a peripheral area of the piezoelectric thin film.

18. The elastic wave device according to claim 1, wherein the insulating layer is made of epoxy resin or polyimide.

* * * * *